(12) United States Patent
Nakata et al.

(10) Patent No.: US 10,667,442 B2
(45) Date of Patent: May 26, 2020

(54) ELECTRONIC DEVICE

(71) Applicant: LENOVO (SINGAPORE) PTE. LTD., Singapore (SG)

(72) Inventors: Munefumi Nakata, Kanagawa (JP); Seiji Yamasaki, Kanagawa (JP)

(73) Assignee: LENOVO SINGAPORE PTE LTD, Singapore (SG)

( * ) Notice: Subject to any disclaimer, the term of this patent is extended or adjusted under 35 U.S.C. 154(b) by 0 days.

(21) Appl. No.: 16/375,319

(22) Filed: Apr. 4, 2019

(65) Prior Publication Data

US 2019/0380231 A1 Dec. 12, 2019

(30) Foreign Application Priority Data

Jun. 7, 2018 (JP) ................................ 2018-109263

(51) Int. Cl.
*H05K 9/00* (2006.01)
*G06F 1/20* (2006.01)

(52) U.S. Cl.
CPC ............ *H05K 9/0071* (2013.01); *G06F 1/20* (2013.01); *H05K 9/0022* (2013.01); *H05K 9/0024* (2013.01); *H05K 9/0032* (2013.01)

(58) Field of Classification Search
CPC ...... H05K 9/022; H05K 9/0024; H05K 9/003; H05K 9/0032
See application file for complete search history.

(56) References Cited

U.S. PATENT DOCUMENTS

| | | | | |
|---|---|---|---|---|
| 5,717,248 | A * | 2/1998 | Neumann | H01L 23/3677 257/706 |
| 7,501,587 | B2 * | 3/2009 | English | H05K 9/0032 174/354 |
| 7,504,592 | B1 * | 3/2009 | Crotty, Jr. | H05K 9/0032 174/372 |
| 7,924,568 | B2 * | 4/2011 | Ho | H01L 23/3677 165/80.3 |
| 8,817,489 | B2 * | 8/2014 | Yang | H05K 1/144 361/816 |
| 10,095,283 | B2 * | 10/2018 | Hur | G06F 1/203 |
| 2009/0091888 | A1 * | 4/2009 | Lin | H01L 23/367 361/704 |

FOREIGN PATENT DOCUMENTS

JP 2011-100891 A 5/2011

* cited by examiner

*Primary Examiner* — Robert J Hoffberg
(74) *Attorney, Agent, or Firm* — Russell Ng PLLC; Antony P. Ng (57) ABSTRACT

An electronic device having a shield structure is disclosed. The shield structure includes a conductive heat diffusion plate that is provided in a position facing a mounting surface of an electronic circuit board on which electronic components, such as a CPU, are mounted, and diffuses heat generated from the CPU, etc.; and a conductive sponge-like member that is firmly fixed to at least either the mounting surface of the electronic circuit board or a surface of the conductive heat diffusion plate which faces the mounting surface of the electronic circuit board, and is provided to separate the CPU, etc. which generate electromagnetic wave noise from antennas.

14 Claims, 6 Drawing Sheets

ELECTRONIC DEVICE

PRIORITY CLAIM

The present application claims benefit of priority under 35 U.S.C. §§ 120, 365 to the previously filed Japanese Patent Application No. JP2018-109263 with a priority date of Jun. 7, 2018, which is incorporated by reference herein.

TECHNICAL FIELD

The present invention relates to electronic devices in general, and in particular to an electronic device having a shield structure that shields against electromagnetic wave noise.

BACKGROUND

An electronic device, such as a notebook personal computer (a laptop PC), a tablet PC, or a mobile phone, is equipped with an electronic circuit board with electronic components, such as a central processing unit (CPU), mounted thereon and an antenna for wireless communication. This sort of electronic device generally includes a shield structure that prevents electromagnetic wave noise generated in an electronic component from affecting the receiving sensitivity of the antenna.

For example, a shield member that shields against electromagnetic wave noise in a chassis of a mobile phone. This shield member is composed of a mount shield section and a cover shield section. The mount shield section is made of a metal frame mounted on an electronic circuit board. The cover shield section is formed into a metal case, and covers an opening of the mount shield section from the upside.

Depending on the sheet-metal processing accuracy of the mount shield section as well as the cover shield section and the degree of proficiency of an assembly worker, the cover shield section may not be able to exactly cover the mount shield section. Not only does this decrease manufacturing efficiency, this may cause the shield member to become loose or interfere with another component. Furthermore, a die is generally used in manufacturing such a shield member, which leads to an increase in component cost.

Consequently, it would be desirable to provide an electronic device that allows for improving the efficiency of manufacturing a shield structure and for reducing the manufacturing cost.

SUMMARY

In accordance with an embodiment of the present disclosure, an electronic device, which includes an electronic circuit board on which an electronic component is mounted, includes an antenna that is able to receive radio waves; and a shield structure that shields against electromagnetic wave noise generated from the electronic component. The shield structure includes a conductive heat diffusion plate that is provided in a position facing a mounting surface of the electronic circuit board on which the electronic component is mounted, and diffuses heat generated from the electronic component; and a conductive sponge-like member that is firmly fixed to at least either the mounting surface of the electronic circuit board or a surface of the conductive heat diffusion plate which faces the mounting surface of the electronic circuit board, and is provided to separate the electronic component which generates the electromagnetic wave noise from the antenna.

With the above-mentioned configuration, the conductive heat diffusion plate and the conductive sponge-like member firmly fixed to at least either the mounting surface of the electronic circuit board or the surface of the conductive heat diffusion plate are provided to surround around the electronic component that generates the electromagnetic wave noise. Accordingly, by using the conductive heat diffusion plate for diffusion of heat of the electronic component as a shield lid and using the conductive sponge-like member as a shield wall, it becomes possible to prevent the electromagnetic wave noise of the electronic component from affecting the antenna. Thus, in the shield structure, the conductive sponge-like member flexibly copes with uneven shapes of the surface of the conductive heat diffusion plate and the mounting surface of the electronic circuit board. As a result, it is possible to exhibit the reliable shielding performance without taking into account the sheet-metal processing accuracy of shield components and the degree of proficiency of an assembly worker; therefore, the manufacturing efficiency is improved, and the manufacturing cost is reduced.

All features and advantages of the present disclosure will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

Figure 1:
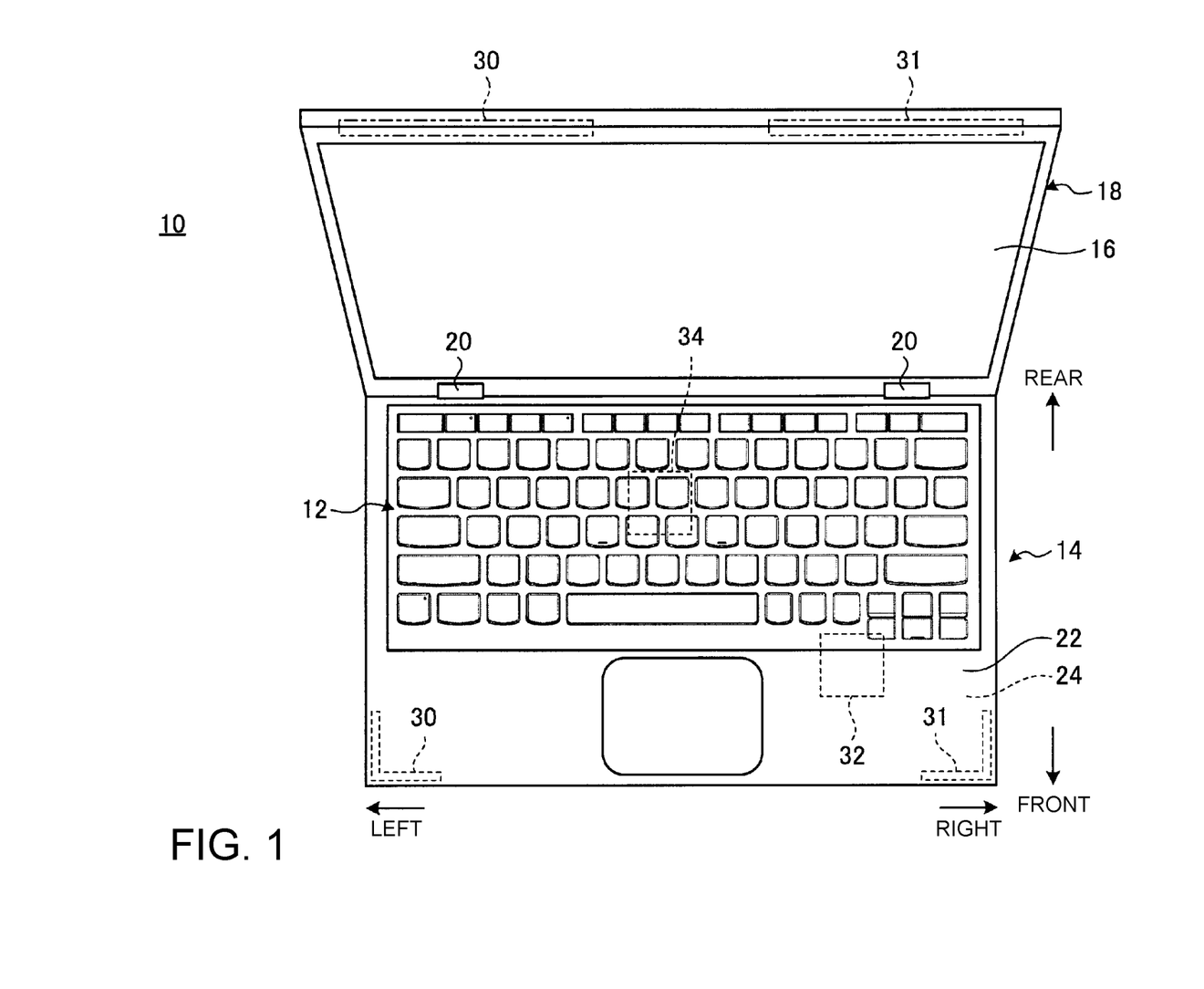
FIG. 1 is a plan view of an electronic device according to an embodiment of the present invention.

FIG. 1 is a plan view of an electronic device 10, according to one embodiment of the present invention. In the present embodiment, the electronic device 10 is a laptop PC as an example. The electronic device 10 may be a tablet PC, a smartphone, a cell-phone, or the like.

As shown in FIG. 1, the electronic device 10 includes a body chassis 14 provided with a keyboard unit 12 and a display chassis 18 provided with a display 16. The display chassis 18 is rotatably connected to the rear end of the body chassis 14 through a pair of right and left hinges 20, 20.

FIG. 1 is a top view of the electronic device 10 in a use mode in which the display chassis 18 is opened from the body chassis 14 by the hinges 20. Hereinafter, based on a direction in which the display 16 of the electronic device 10 in the use mode shown in FIG. 1 is seen from the front, the near and back sides of the body chassis 14 are referred to as the front and the rear, respectively; a thickness direction is referred to as the top and bottom; and a width direction is referred to as the right and left.

The body chassis 14 is a thin box-like chassis formed of a top side cover 22 and an underside cover 24. The top side cover 22 is a plate-like member with a projecting wall at the periphery that is a side wall of the body chassis 14. The top side cover 22 composes a top surface and peripheral side surfaces of the body chassis 14. The underside cover 24 is a plate-like member that composes a bottom surface of the body chassis 14.

The display chassis 18 is electrically connected to the body chassis 14 by wiring (not shown) that runs through the hinges 20. The display 16 is, for example, a liquid crystal display.

Figure 2:
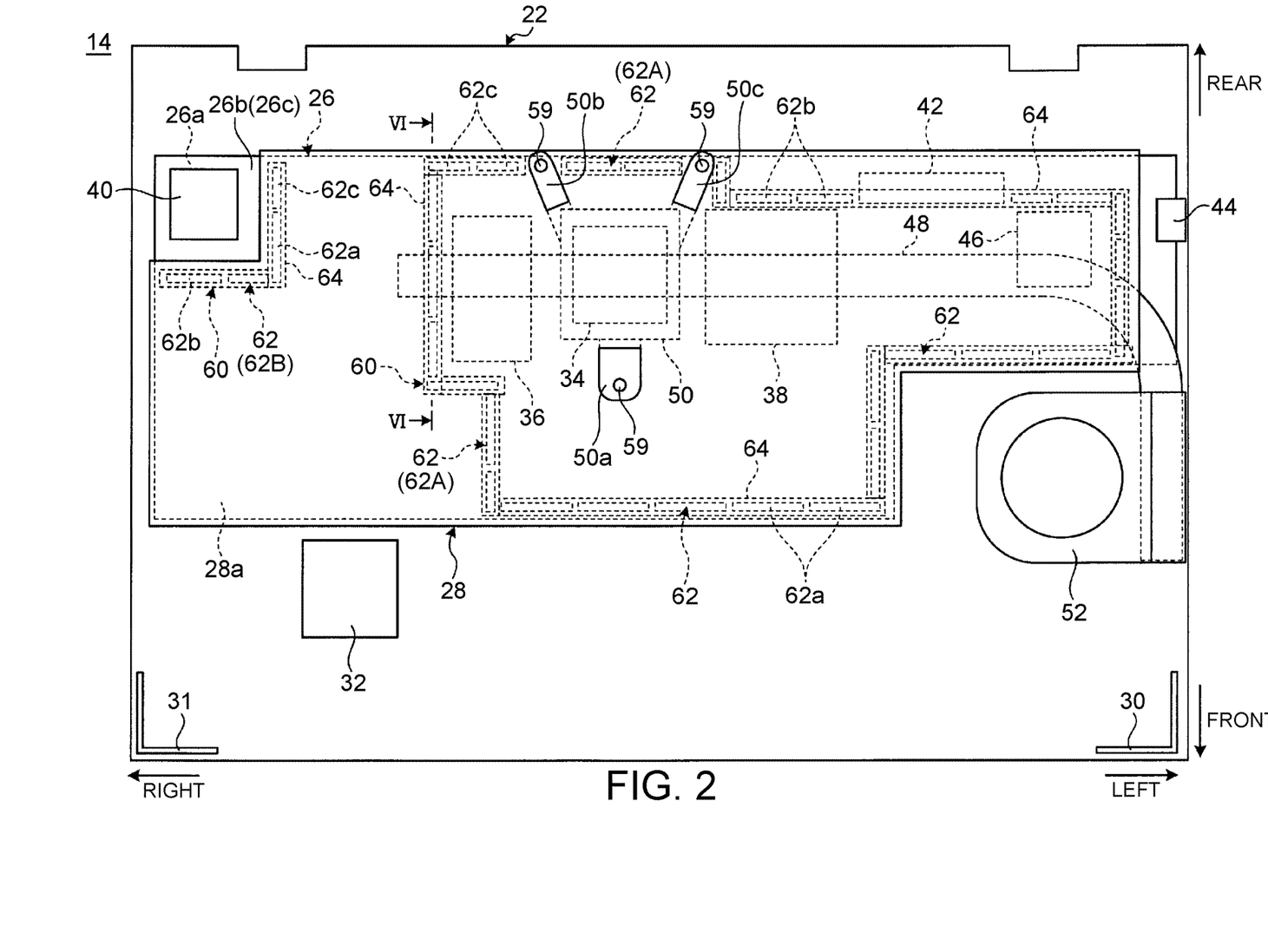
FIG. 2 is a bottom view of the inner structure of a body chassis.

FIG. 2 is a bottom view showing the inner structure of the body chassis 14. FIG. 2 is a diagram of the inside of the body chassis 14 with the underside cover 24 removed therefrom when viewed from the side of an inner surface of the top side cover 22. Inside the body chassis 14, an electronic circuit board 26, a conductive heat diffusion plate 28, a pair of left and right antennas 30 and 31, and a first communication module 32 are housed.

Figure 3:
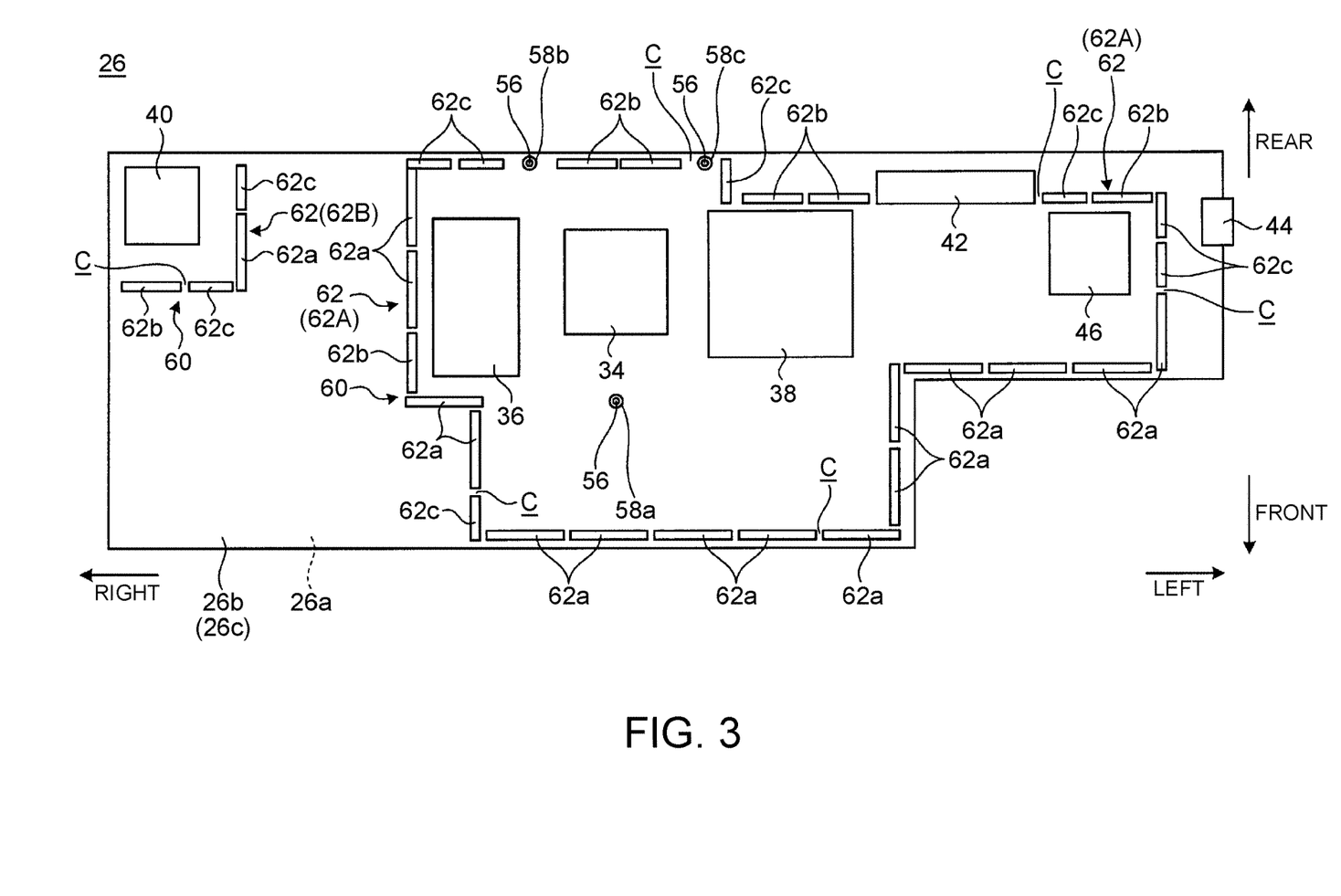
FIG. 3 is a diagram of an electronic circuit board from FIG. 2.

FIG. 3 is a diagram of the electronic circuit board 26 shown in FIG. 2. As shown in FIGS. 2 and 3, the electronic circuit board 26 is a printed circuit board (PCB) on which various electronic components, such as a CPU 34, a power supply circuit 36, a memory 38, a second communication module 40, a connector connecting terminal 42, and an external device connecting terminal 44, are surface-mounted. A back surface 26a of the electronic circuit board 26 that faces to the top in the body chassis 14 is an attachment surface attached to the top side cover 22, and a front surface 26b that faces to the bottom is a mounting surface 26c on which the CPU 34, etc. are mounted.

The CPU 34 is a central processing unit that performs operations pertaining to main control and processing of the electronic device 10. The CPU 34 is a heat-generating body that generates the most heat in the electronic components installed in the body chassis 14. The power supply circuit 36 is a circuit that controls the power supply to the electronic device 10, and is electrically connected to, for example, a battery unit (not shown). The memory 38 is, for example, a read/write recording medium, such as a random access memory (RAM). The power supply circuit 36 and the memory 38 are a heat-generating body next to the CPU 34. The second communication module 40 is electrically connected to the left and right antennas 30 and 31 by a cable (not shown). The second communication module 40 is an electronic component that performs wireless communication with an external access point, etc. through the antennas 30 and 31, and is, for example, a wireless communication module for wireless LAN (WLAN). The second communication module 40 is placed, for example, at the right corner of a rear end of the electronic circuit board 26. A connector of a cable that electrically connects between the electronic circuit board 26 and the components installed in the electronic device 10 is connected to the connector connecting terminal 42. The connector connecting terminal 42 is a metal block-like component. The external device connecting terminal 44 is, for example, a female-side connector compliant with the USB (Universal Serial Bus) Type-C standard. On the mounting surface 26c of the electronic circuit board 26, a controller 46 that controls an external device connected to the external device connecting terminal 44 is mounted.

Figure 4:
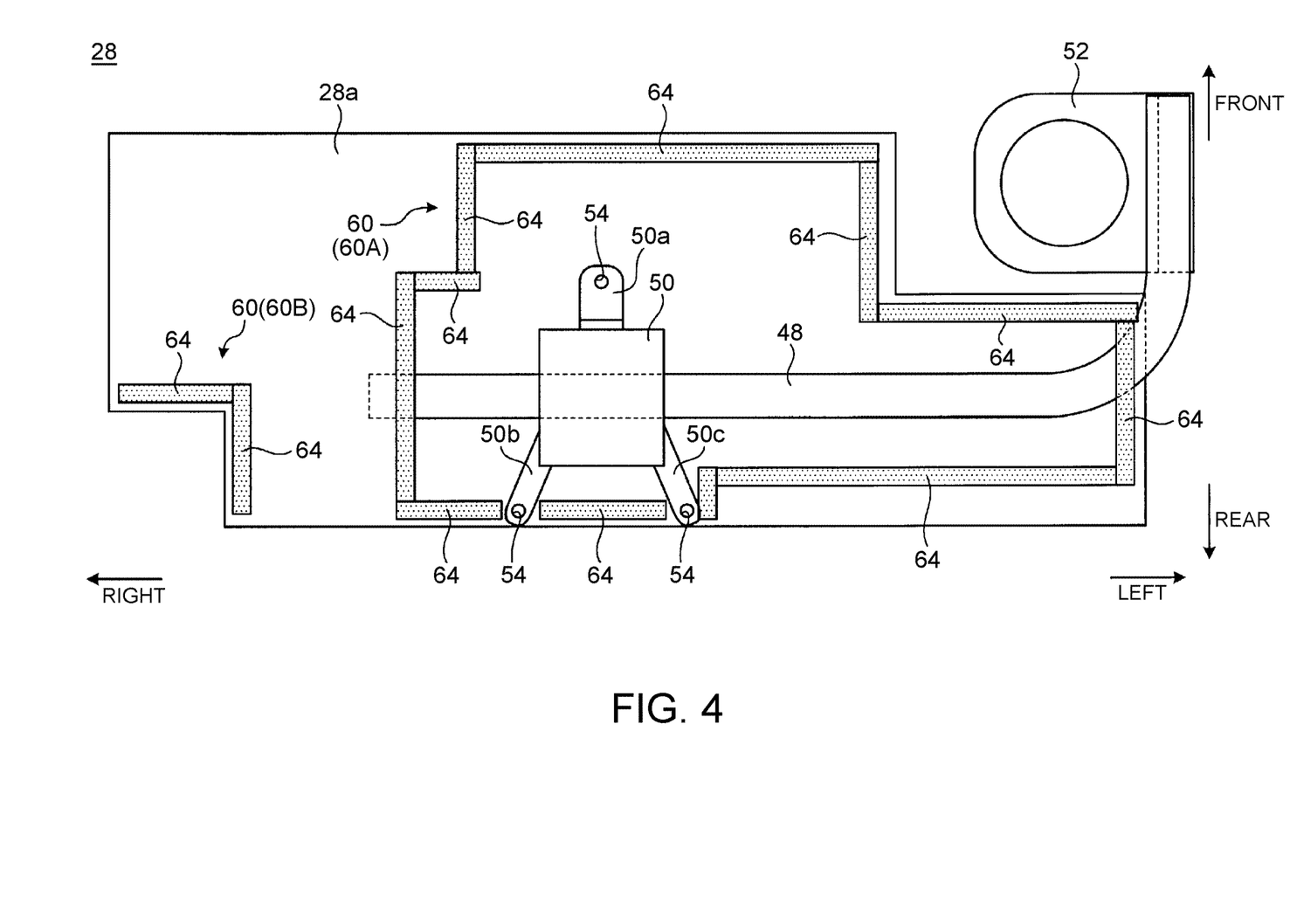
FIG. 4 is a diagram of a conductive heat diffusion plate from FIG. 2.

FIG. 4 is a configuration diagram of the conductive heat diffusion plate 28 shown in FIG. 2. As shown in FIGS. 2 and 4, the conductive heat diffusion plate 28 is a plate-like member that is provided at a position facing the mounting surface 26c of the electronic circuit board 26 and covers almost the entire area of the mounting surface 26c, excluding portions where the second communication module 40 and the external device connecting terminal 44 are installed. The conductive heat diffusion plate 28 is formed of a conductive metal plate, for example, a copper or aluminum plate that has a high thermal conductivity. The conductive heat diffusion plate 28 is a heat spreader that absorbs heat generated from heat-generating bodies, such as the CPU 34, the power supply circuit 36, and the memory 38, on a surface 28a, which faces the mounting surface 26c of the electronic circuit board 26, and diffuses the heat in an in-plane direction.

In a case of the present embodiment, a heat pipe 48 extending in a right-left direction is joined to the surface 28a of the conductive heat diffusion plate 28. The heat pipe 48 is a heat transport device that is configured of, for example, a flattened metal pipe of which both ends are closed, thereby an enclosed space is formed inside thereof, and can transport heat highly efficiently by utilizing a phase change of working fluid held in the enclosed space. One end of the heat pipe 48 is connected to a top surface of the CPU 34 through a heat receiving plate 50 made of copper, aluminum, or the like so that heat from the CPU 34 can be transferred to the heat pipe 48. That is, the heat receiving plate 50, the heat pipe 48, and the conductive heat diffusion plate 28 are stacked on the top surface of the CPU 34 in this order. The other end of the heat pipe 48 is joined to a fan plate 52 stacked on a blower fan (not shown). The heat pipe 48 and the fan plate 52 may be omitted.

The heat receiving plate 50 includes flat springs 50a, 50b, and 50c that project toward three sides. The flat springs 50a to 50c are each provided with a hole 54 on a distal end thereof. Boss-like screw fasteners 58a, 58b, and 58c with an axial female screw hole 56 formed on the center thereof project from the mounting surface 26c of the electronic circuit board 26 (see FIG. 3). The flat springs 50a to 50c are placed in contact with top surfaces of the screw fasteners 58a to 58c, respectively, and are each fastened to the electronic circuit board 26 with a screw 59 screwed into the female screw hole 56 through the hole 54 (see FIG. 2). Accordingly, the heat receiving plate 50 is certainly appressed to the top surface of the CPU 34 without looseness.

As shown in FIGS. 1 and 2, the antennas 30 and 31 have an L shape in a plan view, and are provided at the right and left corners of a front end of the body chassis 14, respectively. The antennas 30 and 31 are, for example, a wireless WAN (WWAN) or WLAN-compliant antenna.

As shown in FIGS. 1 and 2, the first communication module 32 is an electronic component that performs wireless communication with an external base station, etc. through the antennas 30 and 31, and is, for example, a wireless communication module for WWAN. In the case of the present embodiment, the first communication module 32 is placed in the right front of the electronic circuit board 26.

As shown in FIGS. 2 to 4, the electronic device 10 includes a shield structure 60 in the body chassis 14. The shield structure 60 is provided so that a conductor separates electromagnetic wave noise generating sources, such as the CPU 34, the power supply circuit 36, and the memory 38, from the first communication module 32, the second communication module 40, and the antennas 30 and 31. The shield structure 60 shields against electromagnetic wave noise generated from the CPU 34, etc. to prevent this electromagnetic wave noise from affecting the first communication module 32, the second communication module 40, and the antennas 30 and 31. The shield structure 60 includes the conductive heat diffusion plate 28, a conductive wall member 62, and a conductive sponge-like member 64.

Figure 5:
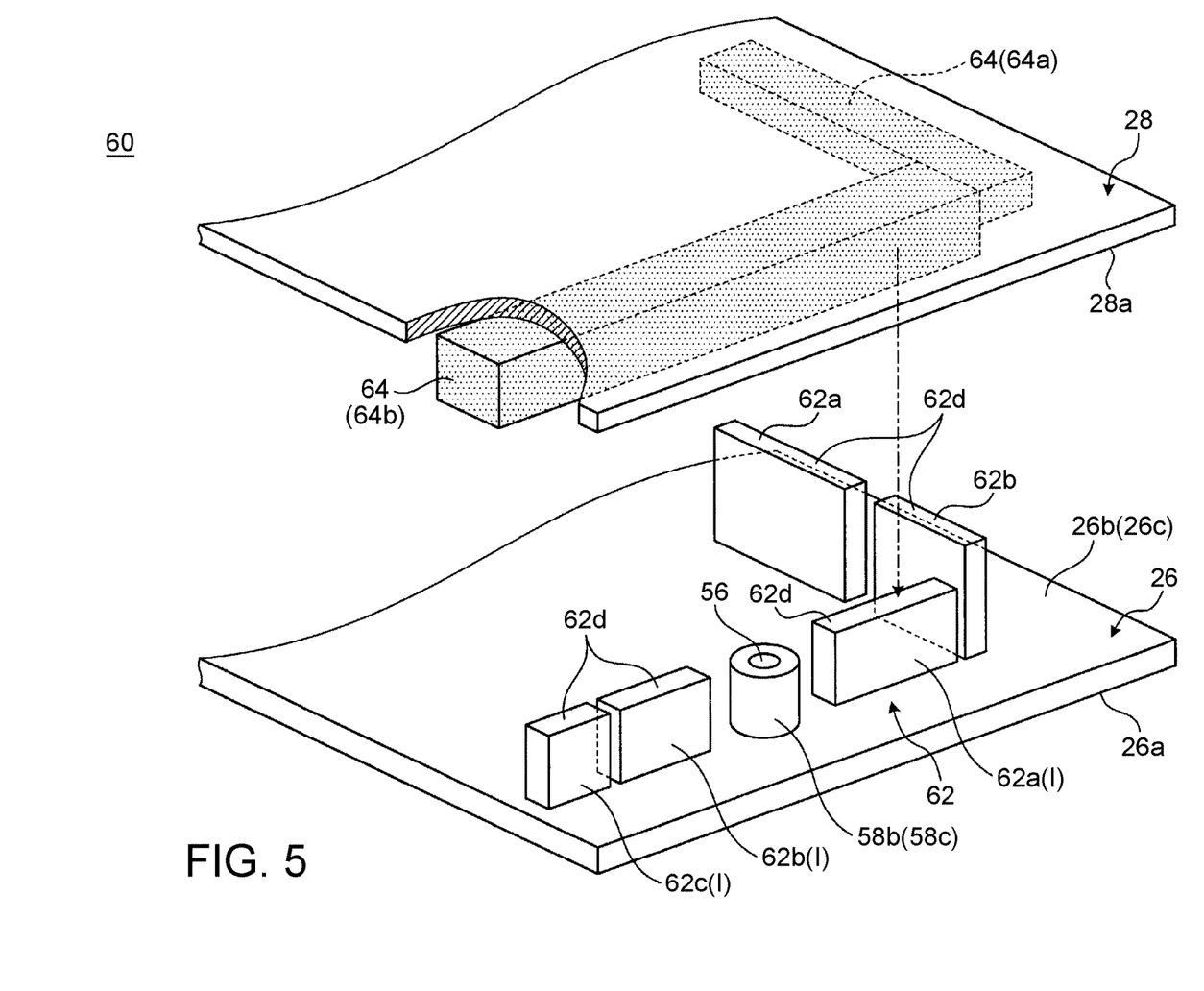
FIG. 5 is an exploded perspective view of a shield structure.
Figure 6A:
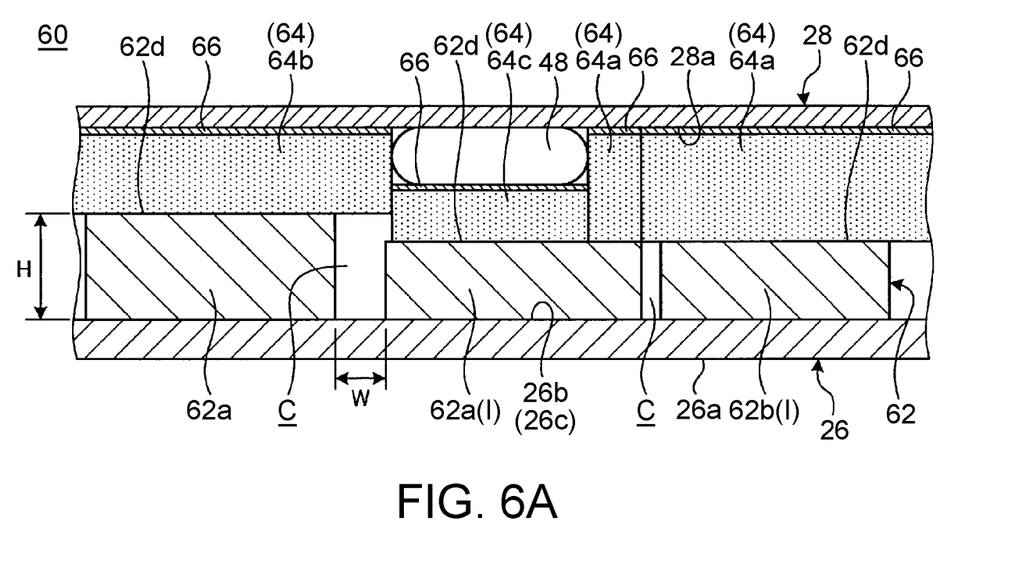
FIG. 6A is a cross-sectional view of the shield structure along a line VI-VI in FIG. 2.
Figure 6B:
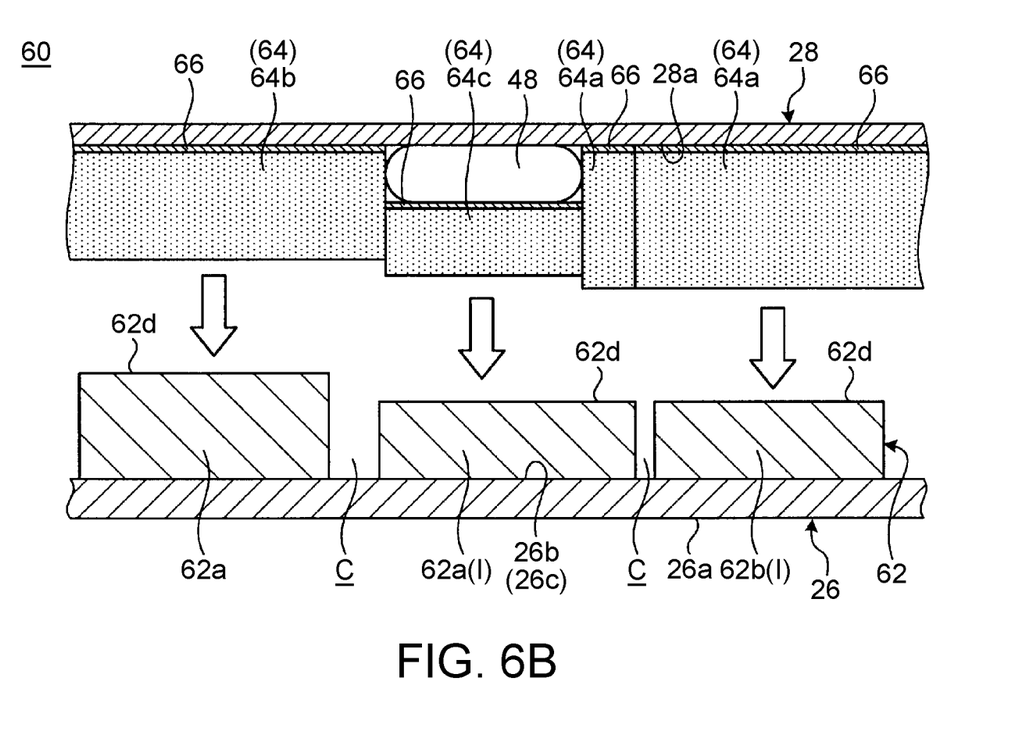
FIG. 6B is a cross-sectional view showing a process of assembling the shield structure from FIG. 6A.

FIG. 5 is an exploded perspective view schematically showing a configuration of the shield structure 60. FIG. 6A is a cross-sectional view schematically showing the configuration of the shield structure 60 along a line VI-VI in FIG. 2. FIG. 6B is a cross-sectional view schematically showing a process of assembling the shield structure 60 shown in FIG. 6A.

As described above, the conductive heat diffusion plate 28 is formed of a conductive metal plate. Thus, the conductive heat diffusion plate 28 has an electromagnetic wave noise shielding performance, and covers the CPU 34, etc. that are electromagnetic wave noise generating sources.

As shown in FIGS. 3 and 5, the conductive wall member 62 is a conductive wall member provided to separate the CPU 34, the power supply circuit 36, the memory 38, etc. from the first communication module 32, the second communication module 40, and the antennas 30 and 31. The conductive wall member 62 includes multiple metal plates 62a, 62b, and 62c mounted on the mounting surface 26c of the electronic circuit board 26; the metal plates 62a, 62b, and 62c are arranged in a longitudinal direction. The metal plates 62a to 62c, for example, a linear plate piece are surface-mounted on the mounting surface 26c of the electronic circuit board 26 together with the electronic components, such as the CPU 34. The metal plates 62a to 62c are configured to have the same plate thickness but differ in width (longitudinal dimension). The metal plates 62a to 62c may be configured to have a lower height like metal plates 62a(1), 62b(1), and 62c(1) shown in FIG. 5. In a case of a configuration example shown in FIG. 3, the conductive wall member 62 is formed of a total of six types of the metal plates 62a to 62c and 62a(1) to 62c(1) that have appropriate combinations of three different widths and two different heights. Needless to say, the number of types of the metal plates forming the conductive wall member 62 may be either more or less than six. The metal plates 62a to 62c and 62a(1) to 62c(1) are, for example, tin-plated stainless steel (SUS304).

There are gaps C between the adjacent metal plates 62a to 62c and 62a(1) to 62c(1) of the conductive wall member 62. In the configuration example shown in FIG. 3, a variety of different gaps C are provided between almost all of the metal plates 62a to 62c and 62a(1) to 62c(1); however, some of the metal plates 62a to 62c and 62a(1) to 62c(1) may be in contact with one another with no gaps C between them. However, the metal plates 62a to 62c and 62a(1) to 62c(1) need to be mounted on the electronic circuit board 26 and arranged so as to thread a space between the electronic components, such as the CPU 34; therefore, in fact, it is difficult to completely eliminate the gaps C.

A reliable electromagnetic wave shielding performance can be secured by setting respective widths W of the gaps C to one-sixth or less of a wavelength of a radio frequency used in the electronic device 10, for example, a WWAN frequency of 800 MHz that the antennas 30 and 31 receive as shown in FIG. 6A. Naturally, as with the widths W, respective heights H of the gaps C are also set to one-sixth or less of the wavelength of a WWAN frequency of 800 MHz that the antennas 30 and 31 receive.

In the case of the present embodiment, the conductive wall member 62 includes a first wall portion 62A, which surrounds the CPU 34, the power supply circuit 36, the memory 38, and the controller 46 together, and a second wall portion 62B, which surrounds two sides of the second communication module 40, on the mounting surface 26c of the electronic circuit board 26. The first wall portion 62A surrounds around the CPU 34, etc., thereby shielding against electromagnetic wave noise generated in the CPU 34, etc. The second wall portion 62B shields the second communication module 40 from the CPU 34, etc.

In gaps between ends of some adjacent metal plates 62a to 62c and 62a(1) to 62c(1) of the first wall portion 62A, the screw fasteners 58b and 58c and the connector connecting terminal 42 that are metal components stand. That is, in part of the first wall portion 62A, the screw fasteners 58b and 58c and the connector connecting terminal 42 that have the electromagnetic wave shielding performance are used as substitutes for the metal plates 62a to 62c and 62a(1) to 62c(1) and form the conductive wall member 62 surrounding the CPU 34, etc. Needless to say, as for gaps C between the ends of the metal plates 62a to 62c and 62a(1) to 62c(1) and the screw fasteners 58b and 58c and the connector connecting terminal 42, respective widths W are set to one-sixth or less of the wavelength of a WWAN frequency of 800 MHz that the antennas 30 and 31 receive.

As shown in FIGS. 4 and 5, the conductive sponge-like member 64 is provided to separate the CPU 34, the power supply circuit 36, the memory 38, etc. from the first communication module 32, the second communication module 40, and the antennas 30 and 31. The conductive sponge-like member 64 is firmly fixed to, for example, the surface 28a of the conductive heat diffusion plate 28 with an adhesive member 66 such as a double-sided tape or an adhesive (see FIG. 6A), and draws the same locus as the conductive wall member 62 on the side of the electronic circuit board 26. Since the adhesive member 66 is very thin, the adhesive member 66 may be a non-conductive material; however, it is preferably a conductive adhesive member. The conductive sponge-like member 64 has a width dimension greater than the plate thickness of the metal plates 62a to 62c and 62a(1) to 62c(1) composing the conductive wall member 62 and extends like a belt. In the case of the present embodiment, for example, a conductive sponge-like member 64a that is thick in a top-bottom direction, a conductive sponge-like member 64b that is thinner than the conductive sponge-like member 64a, and a conductive sponge-like member 64c that is thinner than the conductive sponge-like member 64b are used in the conductive sponge-like member 64 (see FIGS. 5 and 6A). The width and thickness of the conductive sponge-like member 64 can be changed appropriately. The conductive sponge-like member 64 is, for example, a sponge made of a tin-plated copper material or a sponge made of resin such as polyethylene kneaded with carbon. The conductive sponge-like member 64 may be firmly fixed to the mounting surface 26c of the electronic circuit board 26 with the adhesive member 66, or may be firmly fixed to both the mounting surface 26c of the electronic circuit board 26 and the surface 28a of the conductive heat diffusion plate 28 with the adhesive member 66.

Accordingly, the conductive sponge-like member 64 is appressed to upper end surfaces 62d of the metal plates 62a to 62c and 62a(1) to 62c(1), the top surfaces of the screw fasteners 58b and 58c, and a top surface of the connector connecting terminal 42. That is, the conductive sponge-like member 64 electrically connects between the upper end surfaces 62d of the adjacent metal plates 62a to 62c and 62a(1) to 62c(1) and between the top surfaces of the screw fasteners 58b and 58c and the connector connecting terminal 42 through the conductive heat diffusion plate 28, and secures the shielding performance in the gaps C.

As shown in FIGS. 6A and 6B, a top surface of the conductive sponge-like member 64 is installed with its top surface in contact with the upper end surfaces 62d, etc. of the conductive wall member 62 and subjected to a compressive force in the thickness direction. Accordingly, the thickness of the conductive sponge-like member 64 and the heights of the metal plates 62a to 62c and 62a(1) to 62c(1) are appropriately set in accordance with, for example, an uneven shape of the surface 28a of the conductive heat diffusion plate 28 due to the heat pipe 48, etc. Thus, compression amounts of the conductive sponge-like members 64a to 64c become constant, which allows the conductive sponge-like members 64a to 64c to have a uniform conductivity. It is to be noted that by using the low metal plates 62a(1) to 62c(1) in a position overlapping with the heat pipe 48, the compression amount of even a portion of the conductive sponge-like member 64 where the heat pipe 48 is provided can be easily kept constant.

As described above, in the electronic device 10 according to the present embodiment, the shield structure 60 includes: the conductive heat diffusion plate 28 that is provided in a position facing the mounting surface 26c of the electronic circuit board 26 on which electronic components, such as the CPU 34, are mounted, and diffuses heat generated from the CPU 34, etc.; and the conductive sponge-like member 64 that is firmly fixed to at least either the mounting surface 26c of the electronic circuit board 26 or the surface 28a of the conductive heat diffusion plate 28 which faces the mounting surface 26c of the electronic circuit board 26, and is provided to separate the CPU 34, etc. which generate electromagnetic wave noise from the antennas 30 and 31. The conductive wall member 62 may be omitted from the shield structure 60 in this way.

Therefore, the shield structure 60 is provided so that the conductive heat diffusion plate 28 and the conductive sponge-like member 64 that is firmly fixed to at least either the mounting surface 26c of the electronic circuit board 26 or the surface 28a of the conductive heat diffusion plate 28 so as to surround around the CPU 34, etc. Accordingly, by using the conductive heat diffusion plate 28 for diffusion of heat of the electronic components as a shield lid and using the conductive sponge-like member 64 as a shield wall, it becomes possible to prevent electromagnetic wave noise of the CPU 34, etc. from affecting the antennas 30 and 31. Thus, in the shield structure 60 of the electronic device 10, the conductive sponge-like member 64 flexibly copes with the uneven shapes of the surface 28a of the conductive heat diffusion plate 28 and the mounting surface 26c of the electronic circuit board 26. As a result, it is possible to exhibit the reliable shielding performance without taking into account the sheet-metal processing accuracy of shield components and the degree of proficiency of an assembly worker like the conventional technology; therefore, the manufacturing efficiency is improved, and the manufacturing cost is reduced. Furthermore, the shield structure 60 also shields portions between the electromagnetic wave noise generating sources, such as the CPU 34, and the communication modules 32 and 40; therefore, wireless communication quality of the electronic device 10 is further improved.

The shield structure 60 further includes the conductive wall member 62 that is provided on the mounting surface 26c of the electronic circuit board 26 and is placed to separate the CPU 34, etc. from the antennas 30 and 31, and the upper end surface 62d of the conductive wall member 62 is in contact with the conductive sponge-like member 64 firmly fixed to the surface 28a of the conductive heat diffusion plate 28. Thus, the electromagnetic wave noise shielding performance of the shield structure 60 is further improved by the conductive wall member 62 provided between the surface 28a of the conductive heat diffusion plate 28 and the mounting surface 26c of the electronic circuit board 26. In addition, the upper end surface 62d of the conductive wall member 62 certainly allows conduction just by being pressed against the conductive sponge-like member 64. Therefore, it is possible to reduce requirements for the processing accuracy of the conductive wall member 62 and the contact with the conductive heat diffusion plate 28, thus the manufacturing efficiency and the assembly efficiency are improved.

In this case, the conductive wall member 62 includes the multiple metal plates 62a to 62c and 62a(1) to 62c(1) mounted on the mounting surface 26c of the electronic circuit board 26 side by side. Furthermore, there are the gaps C between at least some of the adjacent metal plates 62a to 62c and 62a(1) to 62c(1) of the conductive wall member 62, and the conductive sponge-like member 64 straddles the gaps C between the upper end surfaces 62d of the adjacent metal plates 62a to 62c and 62a(1) to 62c(1). The conductive wall member 62 is formed of the multiple metal plates 62a to 62c and 62a(1) to 62c(1) that are linear plate pieces in this way; therefore, a wall portion for shield can be easily built on the mounting surface 26c of the electronic circuit board 26 on which circuits and electronic components are intricately mounted, which leads to a high workability and versatility. Moreover, the gaps C between the adjacent metal plates 62a to 62c and 62a(1) to 62c(1) certainly allow the conduction to the conductive heat diffusion plate 28 through the conductive sponge-like member 64; therefore, it is possible to secure the shielding performance.

In the electronic device 10 according to the present embodiment, the shield structure 60 includes: the conductive wall member 62 that is provided on the mounting surface 26c of the electronic circuit board 26 on which electronic components, such as the CPU 34, are mounted and is placed to separate the CPU 34, etc. that generate electromagnetic wave noise from the antennas 30 and 31; and a conductive plate (in the present embodiment, the conductive heat diffusion plate 28) that is provided in a position facing the mounting surface 26c of the electronic circuit board 26 and is electrically connected to the upper end surfaces 62d of the multiple metal plates 62a to 62c and 62a(1) to 62c(1). Then, the conductive wall member 62 is formed of the multiple metal plates 62a to 62c and 62a(1) to 62c(1) mounted on the electronic circuit board 26; the metal plates 62a to 62c and 62a(1) to 62c(1) are arranged side by side, and the gaps C are provided between at least some of the adjacent metal plates 62a to 62c and 62a(1) to 62c(1), and the conductive heat diffusion plate 28 straddles the gaps C between the upper end surfaces 62d of the adjacent metal plates 62a to 62c and 62a(1) to 62c(1). The conductive sponge-like member 64 may be omitted from the shield structure 60 in this way. Furthermore, instead of the conductive heat diffusion plate 28, a simple conductive plate not designed for diffusion of heat of the CPU 34, etc. may be used.

Therefore, in such a configuration, electromagnetic wave noise from the CPU 34, etc. can be certainly shielded by the conductive wall member 62 provided between the surface 28a of the conductive heat diffusion plate 28 and the mounting surface 26c of the electronic circuit board 26. At this time, the conductive wall member 62 includes the multiple metal plates 62a to 62c and 62a(1) to 62c(1) arranged through the gaps C; however, a conductive plate (the conductive heat diffusion plate 28) connects between their upper end surfaces 62d, thereby it becomes possible to exhibit the sufficient shielding performance, thus the manufacturing efficiency is improved, and the manufacturing cost is reduced. It is to be noted that the shielding performance can be achieved more certainly by connecting between the upper end surface 62d of the conductive wall member 62 and the conductive plate (the conductive heat diffusion plate 28) by the conductive sponge-like member 64 and a conductive adhesive member, such as the adhesive member 66.

In the electronic device 10, the screw fasteners 58b and 58c and the connector connecting terminal 42 are used as part of the conductive wall member 62. Accordingly, the number of the metal plates 62a to 62c and 62a(1) to 62c(1) used can be reduced, and the manufacturing cost can be further reduced. In other words, a shield structure in which the CPU 34, etc. are surrounded by shield components made of sheet metal just like the conventional one needs to have a complicated structure that avoids interference of the screw fasteners 58b and 58c and the connector connecting terminal 42 that are conductive components as well. On the other hand, in the electronic device 10, components unrelated to the shield structure 60 are used as part of the shield structure 60, thereby it is possible to reduce the component cost, while simplifying the device structure. Metal components other than the screw fasteners 58b and 58c and the connector connecting terminal 42 may be used as part of the conductive wall member 62.

It is to be noted that needless to say, the present invention is not limited to the above-described embodiment, and changes may be freely made without departing from the scope of the invention.

In the above-described embodiment, there is described an example of a configuration in which the antennas 30 and 31 are installed in the body chassis 14; alternatively, the antennas 30 and 31 may be installed in the display chassis 18, for example, like the antennas 30 and 31 indicated by two-dot chain lines in FIG. 1. Also in this case, the radio wave receiving quality of the antennas 30 and 31 can be improved by the shield structure 60.

As has been described, the present invention provides an electronic device having a shield structure that shields against electromagnetic wave noise.

While the invention has been particularly shown and described with reference to a preferred embodiment, it will be understood by those skilled in the art that various changes in form and detail may be made therein without departing from the spirit and scope of the invention.

What is claimed is:

1. An electronic device comprising:
   an electronic circuit board on which an electronic component is mounted;
   an antenna for receiving radio waves; and
   a shield structure that shields against electromagnetic wave noise generated from said electronic component, wherein said shield structure includes:
      a conductive heat diffusion plate, provided in a position facing a mounting surface of said electronic circuit board on which said electronic component is mounted, and diffuses heat generated from said electronic component;
      a conductive wall member, provided on said mounting surface of said electronic circuit board, and separates said electronic component that generates said electromagnetic wave noise from said antenna, wherein said conductive wall member includes a plurality of metal plates arranged side-by-side mounted on said electronic circuit board, wherein at least some of adjacent metal plates of said metal plates of said conductive wall member have a first gap therebetween; and
      a conductive sponge member, firmly fixed to said mounting surface of said electronic circuit board and a surface of said conductive heat diffusion plate that faces said mounting surface of said electronic circuit board, and separates said electronic component that generates said electromagnetic wave noise from said antenna, wherein said conductive sponge member straddles said first gap between upper end surfaces of said at least some of said adjacent metal plates.

2. The electronic device of claim 1, wherein said upper end surfaces of said at least some of said adjacent metal plates of said conductive wall member is in contact with said conductive sponge member firmly fixed to said surface of said conductive heat diffusion plate.

3. The electronic device of claim 1, wherein a width of said first gap between said at least some of said adjacent metal plates is one-sixth or less of a wavelength of said radio waves that said antenna receives.

4. The electronic device of claim 1, wherein a metal component is placed in said first gap between said at least some of said adjacent metal plates, wherein a width of a second gap between said metal component and one of said at least some of said adjacent metal plates is one-sixth or less of a wavelength of a frequency of said radio waves that said antenna receives.

5. The electronic device of claim 4, wherein said metal component includes at least either a screw fastener with a female screw hole into which a screw is screwed or a connector connecting terminal to which a connector is connected.

6. The electronic device of claim 1, wherein said conductive sponge member is made of a tin-plated copper material.

7. The electronic device of claim 1, wherein said conductive sponge member is made of polyethylene kneaded with carbon.

8. An electronic device comprising:
   an electronic circuit board on which an electronic component is mounted;
   an antenna for receiving radio waves;
   a shield structure that shields against electromagnetic wave noise generated from said electronic component, wherein said shield structure includes:
      a conductive heat diffusion plate, provided in a position facing a mounting surface of said electronic circuit board on which said electronic component is mounted, and diffuses heat generated from said electronic component;
      a conductive wall member, provided on said mounting surface of said electronic circuit board, and separates said electronic component that generates said electromagnetic wave noise from said antenna, wherein said conductive wall member includes multiple metal plates arranged side-by-side mounted on said electronic circuit board, wherein said conductive wall member includes:
         a first subset of said multiple metal plates having a first height dimension from that of said mounting surface of said electronic circuit board; and
         a second subset of said multiple metal plates other than said first subset of said multiple metal plates, said second set of said multiple metal plates have a second height dimension from that of said mounting surface of said electronic circuit board, wherein said first height dimension is greater than said second height dimension; and a conductive sponge member, firmly fixed to said mounting surface of said electronic circuit board and a surface of said conductive heat diffusion plate that faces said mounting surface of said electronic circuit board, separates said electronic component that generates said electromagnetic wave noise from said antenna; and a heat pipe narrower than said conductive heat diffusion plate is joined to said surface of said conductive heat diffusion plate, wherein said second subset of said multiple metal plates are placed in a position corresponding to said heat pipe.

9. The electronic device of claim 7, wherein said conductive sponge member is made of a tin-plated copper material.

10. The electronic device of claim 7, wherein said conductive sponge member is made of polyethylene kneaded with carbon.

11. An electronic device comprising:

an electronic circuit board on which an electronic component is mounted;

an antenna receives radio waves; and a shield structure shields against electromagnetic wave noise generated from said electronic component, wherein said shield structure includes:

a conductive wall member, provided on a mounting surface of said electronic circuit board on which said electronic component is mounted, and separates said electronic component that generates said electromagnetic wave noise from said antenna, wherein said conductive wall member includes multiple metal plates mounted on said electronic circuit board, said multiple metal plates being arranged side by side;

a conductive plate provided in a position facing said mounting surface of said electronic circuit board;

a gap provided between at least some of adjacent metal plates of said multiple metal plates of said conductive wall member, wherein said conductive plate straddles said gap between upper end surfaces of said at least some of said adjacent metal plates to provide an electrical connection between said conductive plate and said upper end surfaces of said at least some of said adjacent metal plates; and a conductive adhesive member or a conductive sponge member lies between said conductive plate and said upper end surfaces of said at least some of said adjacent metal plates.

12. The electronic device of claim 11, wherein a width of said gap between said at least some of said adjacent metal plates is one-sixth or less of a wavelength of a frequency of said radio waves that said antenna receives.

13. The electronic device of claim 11, wherein said conductive sponge member is made of a tin-plated copper material.

14. The electronic device of claim 11, wherein said conductive sponge member is made of polyethylene kneaded with carbon.

* * * * *